(12) United States Patent
Zha

(10) Patent No.: US 10,656,457 B2
(45) Date of Patent: May 19, 2020

(54) LIQUID CRYSTAL DISPLAY AND DISPLAY MODULE THEREOF

(71) Applicant: Wuhan China Star Optoelectronics Technology Co., Ltd., Wuhan, Hubei (CN)

(72) Inventor: Guowei Zha, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 321 days.

(21) Appl. No.: 15/736,174

(22) PCT Filed: Nov. 14, 2017

(86) PCT No.: PCT/CN2017/110924
§ 371 (c)(1),
(2) Date: Dec. 13, 2017

(87) PCT Pub. No.: WO2019/085020
PCT Pub. Date: May 9, 2019

(65) Prior Publication Data
US 2020/0041838 A1  Feb. 6, 2020

(30) Foreign Application Priority Data
Oct. 31, 2017 (CN) .......................... 2017 1 1042966

(51) Int. Cl.
*G02F 1/1335* (2006.01)
*G02F 1/1362* (2006.01)
(Continued)

(52) U.S. Cl.
CPC .. *G02F 1/133528* (2013.01); *G02F 1/133514* (2013.01); *G02F 1/136209* (2013.01);
(Continued)

(58) Field of Classification Search
None
See application file for complete search history.

(56) References Cited

U.S. PATENT DOCUMENTS 9,857,626 B1 * 1/2018 Zha ................... G02F 1/133528
9,869,898 B2 * 1/2018 Nielson ............... G02B 5/3058
(Continued)

FOREIGN PATENT DOCUMENTS

CN           106125185 A     11/2016
CN           106405927 A     2/2017
(Continued)

*Primary Examiner* — Ryan Crockett
(74) *Attorney, Agent, or Firm* — Hemisphere Law, PLLC; Zhigang Ma

(57) ABSTRACT

The present disclosure provides a liquid crystal display and a display module thereof, the display module includes a lower polarizer, a TFT array substrate, a liquid crystal layer, a color filter and a upper polarizer. The display module further includes a metal electrode layer arranged between the color filter and the liquid crystal layer, the metal electrode layer includes a dielectric layer and a metal wire grid layer, and the metal wire grid layer is arranged on a surface of the dielectric layer facing the liquid crystal layer. The metal wire grid layer is used as a common electrode layer of the display module, thus replacing the traditional transparent electrode ITO and avoiding the problem that the transparent electrode ITO easily causes brittle fracture during bending resulting in electrical abnormality and at the same time can improve the contrast of the entire liquid crystal display.

17 Claims, 2 Drawing Sheets

(51) Int. Cl.
  *H01L 27/12*  (2006.01)
  *G02F 1/1333*  (2006.01)
(52) U.S. Cl.
  CPC ...... *G02F 1/136286* (2013.01); *H01L 27/124* (2013.01); *G02F 2001/133357* (2013.01); *G02F 2001/133548* (2013.01)

(56) References Cited

U.S. PATENT DOCUMENTS

| | | | |
|---|---|---|---|
| 2008/0037094 A1 | 2/2008 | Hwang et al. | |
| 2012/0057106 A1* | 3/2012 | Park | G02F 1/133528 349/96 |
| 2012/0113339 A1* | 5/2012 | Park | G06F 3/0412 349/33 |
| 2012/0140148 A1* | 6/2012 | Kadowaki | G02B 5/3058 349/64 |
| 2014/0152922 A1* | 6/2014 | Bae | G02F 1/133711 349/15 |
| 2015/0050804 A1* | 2/2015 | Lu | G02B 27/44 438/618 |
| 2016/0077265 A1 | 3/2016 | Choi et al. | |
| 2016/0170261 A1* | 6/2016 | Nam | G02F 1/133528 257/72 |
| 2017/0017115 A1* | 1/2017 | Kim | G02F 1/13439 |
| 2017/0097543 A1* | 4/2017 | Kang | G02F 1/133528 |
| 2017/0285400 A1* | 10/2017 | Park | G02F 1/133553 |
| 2018/0188598 A1* | 7/2018 | Cui | G02F 1/1335 |
| 2018/0196304 A1* | 7/2018 | Zha | G02F 1/133528 |
| 2018/0335882 A1* | 11/2018 | Yoon | G06F 3/0412 |

FOREIGN PATENT DOCUMENTS

| | | |
|---|---|---|
| CN | 106597762 A | 4/2017 |
| CN | 106773405 A | 5/2017 |
| CN | 107203065 A | 9/2017 |
| CN | 107229158 A | 10/2017 |
| CN | 107272249 A | 10/2017 |
| CN | 107290895 A | 10/2017 |

* cited by examiner

_(1)_

LIQUID CRYSTAL DISPLAY AND DISPLAY MODULE THEREOF

RELATED APPLICATIONS

The present application is a National Phase of International Application Number PCT/CN2017/110924, filed Nov. 14, 2017, and claims the priority of China Application 201711042966.1, filed Oct. 31, 2017.

FIELD OF THE DISCLOSURE

The present disclosure relates to a liquid crystal display technology field, and more particularly to a liquid crystal display and a display module thereof.

BACKGROUND OF THE DISCLOSURE

With the gradual rise of wearable application devices such as smart glasses, smart watches and the like, the display industry is also in increasing demand for flexible display devices. Organic Light Emitting Display (OLED) has the advantages of self-luminous, thin thickness, wide viewing angle, fast response and so on, which has the natural advantage of flexible display. However, the current OLED industry still has a high technical threshold, the process is difficult, low yield, high cost, high price, these difficulties are hindering the widespread use of OLED. Liquid Crystal Display (LCD) devices have relatively long development history and have gradually overcome the key technologies of color stability, uniformity, reliability, high color gamut, wide viewing angle and become the display technologies that still occupy the mainstream in the market.

However, in the realization process of a flexible liquid crystal display device, adopting a flexible substrate instead of a traditional glass substrate does not mean solving all the problems. On the one hand, due to the thickness of the liquid crystal cell and the influence of the backlight module, the light of the liquid crystal display needs to go through a long path in the thickness direction, and the local thickness change caused by the bending process causes obvious change of the light propagation direction and color crosstalk. On the other hand, the local stress caused by bending makes the non-supporting film layer in the traditional liquid crystal cell prone to brittle fracture, resulting in abnormal function, which is particularly prominent in the conductive layer. Wherein, the conductive layer is generally a transparent conductive layer ITO, and the transparent conductive layer ITO is a brittle material, which is prone to fracture during bending.

SUMMARY OF THE DISCLOSURE

In order to solve the deficiencies of the prior art, the present disclosure provides a liquid crystal display capable of solving the problem of electrical breakdown caused by the brittle fracture of transparent electrode ITO during bending, and at the same time, improving the contrast of the entire liquid crystal display.

The specific technical solution proposed by the present disclosure is as follows: providing a display module, wherein the display module includes a lower polarizer, a TFT array substrate, a liquid crystal layer, a color filter and a upper polarizer, wherein the liquid crystal layer is arranged between the lower polarizer and the upper polarizer, the TFT array substrate is arranged between the lower polarizer and the liquid crystal layer, the color filter is arranged between the liquid crystal layer and the upper polarizer, the display module further includes a metal electrode layer arranged between the color filter and the liquid crystal layer, the metal electrode layer includes a dielectric layer and a metal wire grid layer, and the metal wire grid layer is arranged on a surface of the dielectric layer facing the liquid crystal layer.

Optionally, the color filter includes a planarization layer, a filter layer and a substrate, the filter layer is arranged between the planarization layer and the substrate, the planarization layer is arranged between the filter layer and the dielectric layer, the filter layer includes a photoresist arranged on the substrate at intervals and a black matrix arranged between any two adjacent photoresists.

Optionally, a region corresponding to the metal wire grid layer and the photoresist is provided with first wire grid units, each of the first wire grid units includes a plurality of first metal strips arranged at equal intervals in parallel, a polarization direction of each of the first wire grid units is the same as a direction of an absorption axis of the upper polarizer.

Optionally, a region corresponding to the metal wire grid layer and the black matrix is provided with second wire grid units, each of the second wire grid units includes a plurality of second metal strips arranged at equal intervals in parallel.

Optionally, a width of the first metal strip is equal to a width of the second metal strip, and/or a thickness of the first metal strip and a thickness of the second metal strip are 10 nm~100 nm.

Optionally, the interval between two adjacent first metal strips in each of the first wire grid units is not equal to the interval between two adjacent second metal strips in each of the second wire grid units.

Optionally, material of the first metal strip and the second metal strip are all selected from at least one of Al, Ag or Au.

Optionally, the interval between two adjacent first metal strips in each of the first wire grid units is 20~500 nm, and a duty ratio of each of the first wire grid units is 0.1~0.9.

Optionally, material of the dielectric layer is one of $SiO_2$, SiO, MgO, $Si_3N_4$, $TiO_2$ and $Ta_2O_5$.

The present disclosure further provides a liquid crystal display, the liquid crystal display includes a backlight module and a display module as described above, and the display module is arranged on the backlight module.

The display module proposed in the present disclosure includes a metal electrode layer, the metal electrode layer includes a dielectric layer and a metal wire grid layer, the metal wire grid layer is arranged on a surface of the dielectric layer facing the liquid crystal layer, the metal wire grid layer is used as a common electrode layer of the display module, thus replacing the traditional transparent electrode ITO and avoiding the problem that the transparent electrode ITO easily causes brittle fracture during bending resulting in electrical abnormality and at the same time can improve the contrast of the entire liquid crystal display.

DETAILED DESCRIPTION OF PREFERRED EMBODIMENTS

Figure 1:
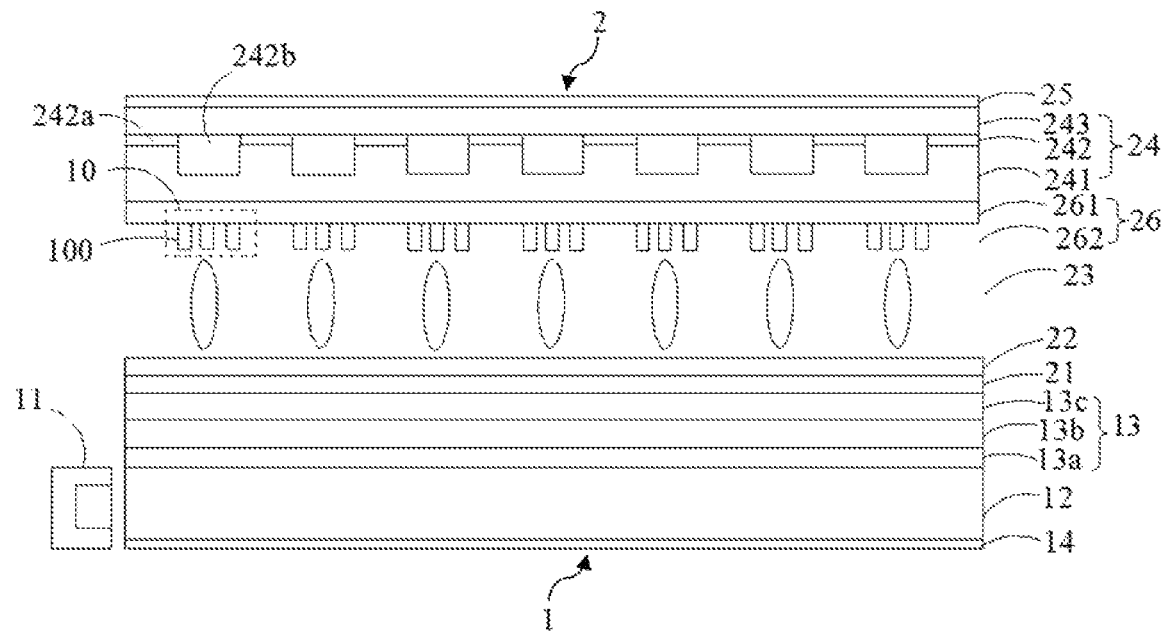
FIG. 1 is a schematic structural diagram of the liquid crystal display in Example 1.

Hereinafter, embodiments of the present disclosure will be described in detail with reference to the accompanying drawings. However, the disclosure may be embodied in many different forms and should not be construed as limited to the specific embodiments set forth herein. Rather, these embodiments are provided to explain the principles of the disclosure and its practical application to thereby enable those of ordinary skill in the art to understand various embodiments of the disclosure and various modifications as are suited to the particular use contemplated. In the drawings, the same reference numerals will always be used to refer to the same elements.

Embodiment 1

Referring to FIG. 1, the liquid crystal display of the present embodiment includes a backlight module 1 and a display module 2. The display module 2 includes a lower polarizer 21, a TFT array substrate 22, a liquid crystal layer 23, a color filter 24 and a upper polarizer 25. The liquid crystal layer 23 is arranged between the lower polarizer 21 and the upper polarizer 25, the TFT array substrate 22 is between the lower polarizer 21 and the liquid crystal layer 23, and the color filter 24 is arranged between the liquid crystal layer 23 and the upper polarizer 25. The display module 2 further includes a metal electrode layer 26 arranged between the color filter 24 and the liquid crystal layer 23, the metal electrode layer 26 includes a dielectric layer 261 and a metal wire grid layer 262, and the metal wire grid layer 262 is arranged on a surface of the dielectric layer 261 facing the liquid crystal layer 23.

The metal wire grid layer 262 serves as a common electrode layer of the display module 2, replacing the conventional transparent electrode ITO. Thus, the transparent electrode ITO avoids the problem of electrical breakdown due to brittle fracture during bending.

The color filter 24 of the present embodiment includes a planarization layer 241, a filter layer 242 and a substrate 243. The filter layer 242 is arranged between the planarization layer 241 and the substrate 243, the planarization layer 241 is arranged between the filter layer 242 and the dielectric layer 261, the filter layer 242 includes a photoresist 242a arranged on the substrate 243 at intervals and a black matrix 242b arranged between any two adjacent photoresists 242a. The photoresist 242a includes a red photoresist, a green photoresist, and a blue photoresist. The red photoresist is capable of transmitting red light, the green photoresist is capable of transmitting light, and the blue photoresist is capable of transmitting blue light. The black matrix 242b does not allow light to pass through.

In the actual manufacturing process of the filter layer 242, forming the black matrix 242b on the surface of the substrate 243, forming a plurality of pixel openings on the black matrix 242b. and filling the material of the photoresist in the pixel openings to form the photoresist 242a. The thickness of the photoresist 242a is greater than the thickness of the black matrix 242b, so that forming the filter layer 242 on the surface of the substrate 243, and forming the planarization layer 241 on the surfaces of the black matrix 242b and the photoresist 242a.

The TFT array substrate 22 and the substrate 243 of the present embodiment are flexible substrates, material of the flexible substrate is selected from polymethylmethacrylate, polycarbonate, polyethylene, polypropylene, polyethylene terephthalate or polyimide.

Figure 2:
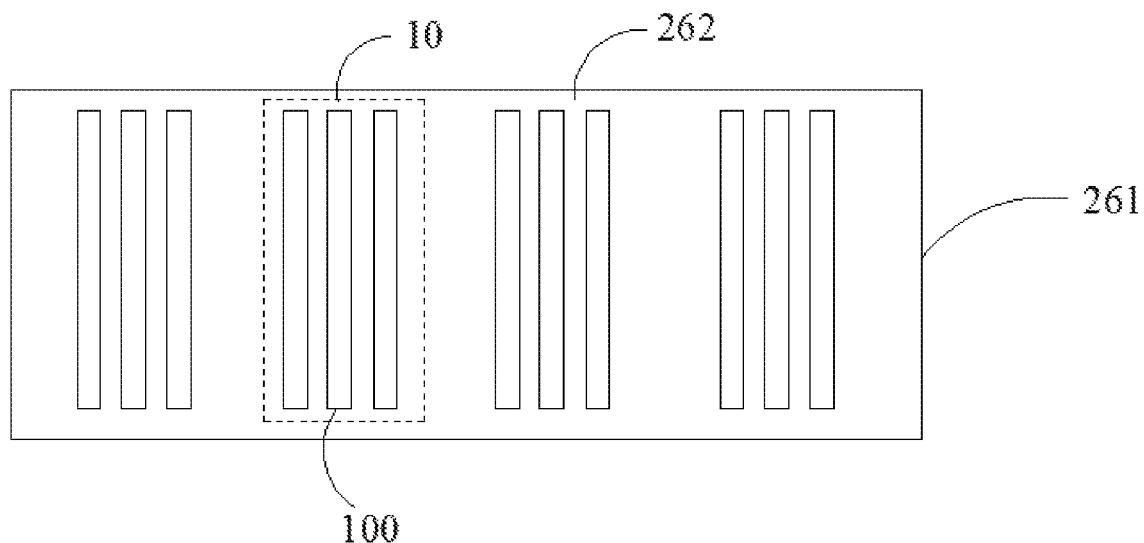
FIG. 2 is a schematic structural diagram of the metal wire grid layer in Example 1.

Referring to FIG. 2, a region corresponding to the metal wire grid layer 262 and the photoresist 242a is provided with first wire grid units 10, each of the first wire grid units 10 includes a plurality of first metal strips 100 arranged at equal intervals in parallel. The polarization direction of each of the first wire grid units 10 is the same as the absorption axis of the upper polarizer 25 can transmit TM polarized light having polarization direction perpendicular to the first metal strip 100 and reflect the TE polarized light having the polarization direction parallel to the first metal strip 100. Its role is similar to the upper polarizer 25, which can further increase the polarization degree of the liquid crystal display. In addition, the ambient light passes through the upper polarizer 25 to form polarized light, the polarized light is totally transmitted through the first wire grid unit 10, so that the polarized light in other polarization directions can be prevented from being reflected by the first wire grid unit 10, thereby reducing the contrast of the liquid crystal display. The first wire grid units 10 corresponding to the photoresists 242a of the same color are the same, the first wire grid units 10 corresponding to the photoresists 242a of different colors may be the same or different, FIG. 2 shows a case where the first wire grid units 10 corresponding to the different color photoresists 242a are all the same.

In the present embodiment, the region corresponding to the metal wire grid layer 262 and the black matrix 242b is an entire surface structure, and the light is impermeable, so that the flexibility of the metal wire grid layer 262 can be further increased. The width of the first metal strip 100 is from 10 nm to 100 nm, and material of the first metal strip 100 is at least one selected from Al, Ag or Au. The interval between two adjacent first metal strips 100 in each first wire grid unit 10 is 20~500 nm, and the duty ratio of each first wire grid unit 10 is 0.1~0.9.

In the present embodiment, material of the dielectric layer 261 is one of $SiO_2$, SiO, MgO, $Si_3N_4$, $TiO_2$ and $Ta_2O_5$.

The backlight module 1 in the present embodiment is a side-type backlight module and includes a backlight 11, a light guide plate 12 and an optical film module 13.

The backlight 11 is arranged on a side surface of the light guide plate 12. A light incident surface of the light guide plate 12 refers to a surface of the light guide plate 12 facing the backlight 11. The optical film module 13 is arranged between the light guide plate 12 and the lower polarizer 21. The light emitted by the backlight 11 enters the light guide plate 12 and exits from the light emitting surface of the light guide plate 12 after the light is reflected by the light guide plate 12 multiple times. Here, the light emitting surface of the light guide plate 12 refers to the surface of the light guide plate 12 opposite to the optical film module 13. The light emitted from the light exit surface of the light guide plate 12 re-enters the optical film module 13.

The optical film module 13 includes a lower diffusion sheet 13a, a light-increasing sheet 13b and an upper diffusion sheet 13c arranged in order from the bottom to the top. The upper diffusion sheet 13c is arranged between the light-increasing sheet 13b and the display module 2, the lower diffusion sheet 13a is arranged between the light-increasing sheet 13b and the light guide plate 12. The lower diffusion sheet 13a is for uniformly concentrating the light emitted from the light exit surface of the light guide plate 12 onto the light-increasing sheet 13b, the light-increasing sheet 13b is for collecting the dispersed light emitted by the lower diffusion sheet 13a to improve brightness, the upper diffusion sheet 13*c* is for atomizing the light emitted from the light-increasing sheet 13*b* and uniformly radiates the light. The light-increasing sheet 13*b* is usually a prism sheet.

The backlight module 1 of the present embodiment further includes a reflective layer 14 arranged on the bottom of the light guide plate 12. The reflective layer 14 may be a reflective sheet or a reflective coating applied on the bottom of the light guide plate 12.

Embodiment 2

Figure 3:
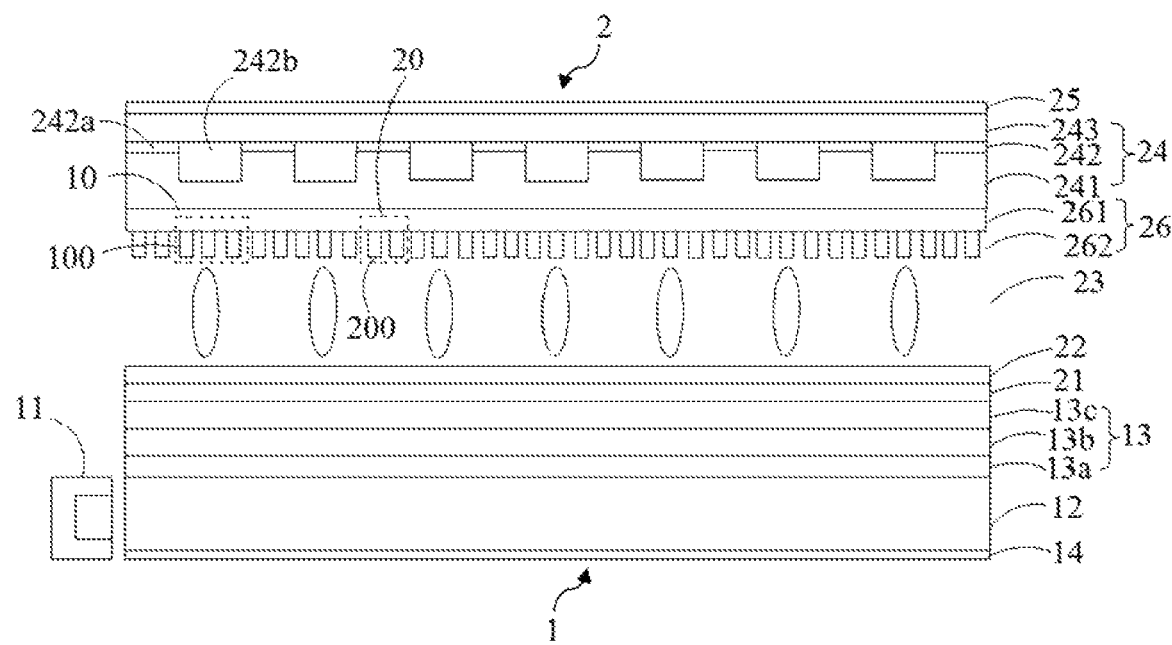
FIG. 3 is a schematic structural diagram of the liquid crystal display in Example 2.
Figure 4:
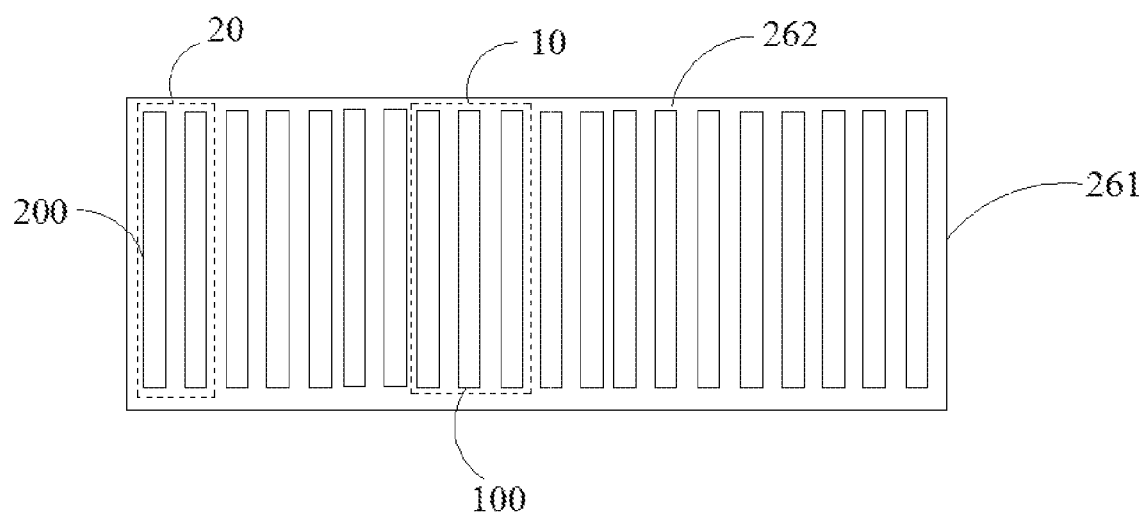
FIG. 4 is a schematic structural diagram of the metal wire grid layer in Example 2.

Referring to FIG. 3 and FIG. 4, the difference between the present embodiment and Embodiment 1 is that the second wire grid unit 20 is arranged in a region corresponding to the metal wire grid layer 262 and the black matrix 242*b* in the present embodiment, each second wire grid unit 20 includes a plurality of second metal strips 200 arranged at equal intervals. The polarization direction of each of the second wire grid units 20 is the same as the absorption axis of the upper polarizer 25 can transmit TM polarized light having polarization direction perpendicular to the second metal strip 200 and reflect the TE polarized light having the polarization direction parallel to the second metal strip 200. Its role is similar to the upper polarizer 25. The polarized light transmitted from the second wire grid unit 20 is blocked by the black matrix 242*b*.

In the present embodiment, the area corresponding to the metal wire grid layer 262 and the black matrix 242*b* is also a wire grid structure, so that the bending ability of the metal wire grid layer 262 can be further increased and the reliability of the liquid crystal display can be improved.

The foregoing descriptions are merely specific implementation manners of the present application. It should be noted that, for those skilled in the art, several improvements and modifications can be made without departing from the principle of the present disclosure, and these improvements and modifications should also be considered as the protection scope of the present application.

What is claimed is:

1. A display module, comprising a lower polarizer, a TFT array substrate, a liquid crystal layer, a color filter and an upper polarizer, wherein the liquid crystal layer is arranged between the lower polarizer and the upper polarizer, the TFT array substrate is arranged between the lower polarizer and the liquid crystal layer, the color filter is arranged between the liquid crystal layer and the upper polarizer, the display module further comprises a metal electrode layer arranged between the color filter and the liquid crystal layer, the metal electrode layer comprises a dielectric layer and a metal wire grid layer, and the metal wire grid layer is arranged on a surface of the dielectric layer facing the liquid crystal layer, wherein the color filter comprises a black matrix, and a region corresponding to the metal wire grid layer and the black matrix is provided with second wire grid units, each of the second wire grid units comprises a plurality of second metal strips arranged at equal intervals in parallel.

2. The display module according to claim 1, wherein the color filter comprises a planarization layer, a filter layer and a substrate, the filter layer is arranged between the planarization layer and the substrate, the planarization layer is arranged between the filter layer and the dielectric layer, the filter layer comprises a photoresist arranged on the substrate at intervals and the black matrix arranged between any two adjacent photoresists.

3. The display module according to claim 2, wherein a region corresponding to the metal wire grid layer and the photoresist is provided with first wire grid units, each of the first wire grid units comprises a plurality of first metal strips arranged at equal intervals in parallel, a polarization direction of each of the first wire grid units is the same as a direction of an absorption axis of the upper polarizer.

4. The display module according to claim 3, wherein a width of the first metal strip is equal to a width of the second metal strip, and/or a thickness of the first metal strip and a thickness of the second metal strip are 10 nm-100 nm.

5. The display module according to claim 3, wherein the interval between two adjacent first metal strips in each of the first wire grid units is not equal to the interval between two adjacent second metal strips in each of the second wire grid units.

6. The display module according to claim 3, wherein material of the first metal strip and the second metal strip are all selected from at least one of Al, Ag or Au.

7. The display module according to claim 3, wherein the interval between two adjacent first metal strips in each of the first wire grid units is 20~500 nm, and a duty ratio of each of the first wire grid units is 0.1~0.9.

8. The display module according to claim 3, wherein material of the dielectric layer is one of $SiO_2$, SiO, MgO, $Si_3N_4$, $TiO_2$ and $Ta_2O_5$.

9. The display module according to claim 2, wherein material of the dielectric layer is one of $SiO_2$, SiO, MgO, $Si_3N_4$, $TiO_2$ and $Ta_2O_5$.

10. The display module according to claim 1, wherein material of the dielectric layer is one of $SiO_2$, SiO, MgO, $Si_3N_4$, $TiO_2$ and $Ta_2O_5$.

11. A liquid crystal display, comprising a backlight module and a display module, wherein the display module is arranged on the backlight module, the display module comprises a lower polarizer, a TFT array substrate, a liquid crystal layer, a color filter and an upper polarizer, the liquid crystal layer is arranged between the lower polarizer and the upper polarizer, the TFT array substrate is arranged between the lower polarizer and the liquid crystal layer, the color filter is arranged between the liquid crystal layer and the upper polarizer, the display module further comprises a metal electrode layer arranged between the color filter and the liquid crystal layer, the metal electrode layer comprises a dielectric layer and a metal wire grid layer, and the metal wire grid layer is arranged on a surface of the dielectric layer facing the liquid crystal layer, wherein the color filter comprises a black matrix, and a region corresponding to the metal wire grid layer and the black matrix is provided with second wire grid units, each of the second wire grid units comprises a plurality of second metal strips arranged at equal intervals in parallel.

12. The liquid crystal display according to claim 11, wherein the color filter comprises a planarization layer, a filter layer and a substrate, the filter layer is arranged between the planarization layer and the substrate, the planarization layer is arranged between the filter layer and the dielectric layer, the filter layer comprises a photoresist arranged on the substrate at intervals and the black matrix arranged between any two adjacent photoresists.

13. The liquid crystal display according to claim 12, wherein a region corresponding to the metal wire grid layer and the photoresist is provided with first wire grid units, each of the first wire grid units comprises a plurality of first metal strips arranged at equal intervals in parallel, a polarization direction of each of the first wire grid units is the same as a direction of an absorption axis of the upper polarizer.

14. The liquid crystal display according to claim 13, wherein a width of the first metal strip is equal to a width of the second metal strip, and/or a thickness of the first metal strip and a thickness of the second metal strip are 10 nm-100 nm.

15. The liquid crystal display according to claim 13, wherein the interval between two adjacent first metal strips in each of the first wire grid units is not equal to the interval between two adjacent second metal strips in each of the second wire grid units.

16. The liquid crystal display according to claim 13, wherein material of the first metal strip and the second metal strip are all selected from at least one of Al, Ag or Au.

17. The liquid crystal display according to claim 13, wherein the interval between two adjacent first metal strips in each of the first wire grid units is 20~500 nm, and a duty ratio of each of the first wire grid units is 0.1~0.9.

* * * * *